(12) United States Patent
Gallezot et al.

(10) Patent No.: US 7,134,067 B2
(45) Date of Patent: Nov. 7, 2006

(54) APPARATUS AND METHOD FOR ALLOWING A DIRECT DECODE OF FIRE AND SIMILAR CODES

(75) Inventors: Rene Gallezot, La Colle sur Loup (FR); Rene Glaise, Nice (FR); Michel Poret, Gattieres (FR)

(73) Assignee: International Business Machines Corporation, Armonk, NY (US)

( * ) Notice: Subject to any disclaimer, the term of this patent is extended or adjusted under 35 U.S.C. 154(b) by 443 days.

(21) Appl. No.: 10/249,182

(22) Filed: Mar. 20, 2003

(65) Prior Publication Data
US 2003/0182615 A1 Sep. 25, 2003

(30) Foreign Application Priority Data
Mar. 21, 2002 (EP) .................. 02368029

(51) Int. Cl.
*H03M 13/03* (2006.01)
(52) U.S. Cl. .................. 714/793; 714/785
(58) Field of Classification Search ............ 714/793, 714/774, 779, 757, 785
See application file for complete search history.

(56) References Cited

U.S. PATENT DOCUMENTS

| | | | | |
|---|---|---|---|---|
| 3,678,469 A | * | 7/1972 | Freeman et al. | 714/779 |
| 3,859,630 A | * | 1/1975 | Bennett | 714/757 |
| 4,677,623 A | * | 6/1987 | Iwasaki et al. | 714/762 |
| 5,381,423 A | * | 1/1995 | Turco | 714/762 |
| 6,640,327 B1 | * | 10/2003 | Hallberg | 714/785 |
| 6,888,945 B1 | * | 5/2005 | Horrall | 381/73.1 |

OTHER PUBLICATIONS

Hideki Imai, Two-dimensional Fire Codes, Nov. 1973, IEEE.*
Bahl et al., Single and Multiple Burst Correcting Properties of a Class of Cyclic Product Codes, Sep. 1971, IEEE.*

* cited by examiner

*Primary Examiner*—Albert Decady
*Assistant Examiner*—Mujtaba Chaudry
(74) *Attorney, Agent, or Firm*—Anthony J. Canale

(57) ABSTRACT

The present invention describes direct decoding of Error Correction Codes (ECC) such as, for example, FIRE and similar codes, and detecting and correcting errors occurring in burst, without requiring any pattern shift or sequential logic. According to the present invention, the syndrome of a code generated with a degree-d polynomial is split into sub-syndromes that are combined to form at least one kind of error pattern from which an error pattern is picked. If the picked error pattern does not correspond to an uncorrectable error and errors are not confined within first d bits, one of the sub-syndromes is selected according to the correction mode. The ranks of this selected sub-syndrome and picked error pattern in the Galois field generated by a factor of the degree-d polynomial are determined. Determining the rank of an error pattern vector being larger than vectors of a Galois field, in this Galois field, consists of extracting the burst of errors from the error pattern, determining the rank of the burst of errors in the Galois field and adjusting this rank on the basis of the position of the burst of errors in the error pattern. Ranks of this selected sub-syndrome and picked error pattern are subtracted to determine a group first vector. Then, the error pattern can be applied to the group determined by the group first vector so as to correct the message or data packet.

7 Claims, 12 Drawing Sheets

PRIOR ART

APPARATUS AND METHOD FOR ALLOWING A DIRECT DECODE OF FIRE AND SIMILAR CODES

BACKGROUND OF THE INVENTION

1. Field of the Invention

The present invention relates to Error Correcting Codes (ECC) in general, and more particularly applies to a class of Cyclic Redundancy Check (CRC) codes such as FIRE and similar codes capable of detecting and correcting errors occurring in bursts.

2. Background of the Invention

The rate at which data are transmitted through communications networks has dramatically increased in recent years. Fueled by advancements achieved in fiber and optoelectronic devices and techniques such as Dense Wavelength Division Multiplexing (DWDM), which allow multiplication of the bandwidth of a single fiber by merging many wavelengths on it, the telecommunications and networking industry developed devices capable of routing and switching the resulting large amount of data that converge, and thus must be dispatched, at each network node. Typically, routers and switches situated at those network nodes have now to cope with the requirement of having to move data at aggregate rates that must be expressed in hundreds of giga ($10^9$) bits per second while multi tera ($10^{12}$) bits per second rates must be considered for new devices under development.

Due to the considerable progress that has been made in optoelectronics which has allowed the transport of data from node to node at such high rates, it remains that switching and routing of the data is still done in the electrical domain at each network node. This is due to no optical memory available yet that would permit the temporary storage of the frames of transmitted data while they are examined to determine their final destination. The temporary storage of data must still be done in the electrical domain using traditional semiconductor technologies and memories. However, the electrical technologies based on semiconductors have not enjoyed the same level of improvement as compared to the optoelectronic ones. Especially, the transmission of signals on printed ciruit (PC) boards and backplanes suffers intrinsic limitations due to the transmission medium (PC boards), the cables and the connectors that must be used to realize the interconnections. The state of the art for an electrical link is currently a 2.5 Gbps link while 5 and 10 Gbps links are considered for future development. However, in order to reach such a transmission rate in the electrical domain, while maintaining bit error rate (BER) at a low level, transmitted data must be encoded. To this end, a so-called 8B/10B code, developed under the auspices of the American National Standards Institute (ANSI) by a Task Group X3T9.3 of the Technical Committee in 1992, has been largely adopted. However, the use of the 8B/10B code contributes to reduce the actual link bandwidth to 2 Gbps. Hundreds and even thousands of those links need to be used to concentrate and dispatch the flows of bits entering and leaving an electrical Terabit per second switching node. Actually, at least five hundred 2 Gbps links IN and five hundred 2 Gbps links OUT would be required, per Terabit, to implement a switching node. Even though BER is low, the multiplication of those links and the huge throughput handled by the switching nodes make them susceptible to frequent errors. As an example, assuming that the BER on one link can be specified to $10^{-15}$, an already exceptionally good value, then one transmission error may happen about every 8 minutes (i.e. about 500 seconds) in a Terabit switching node ($2 \times 10^9 \times 1000$ links=$2 \times 10^{12}$). And, because the links are encoded, more than a single transmitted bit is likely to be affected after decoding. In the 8B/10B code mentioned hereinabove, a single transmission error can thus span over 5 decoded bits.

On the other hand, the very large scale integration (VLSI) progress of semiconductor technologies, i.e. continued miniaturization, reduced voltages, increasing memory bit counts, has revealed a type of error known as a "soft error". Soft errors are changes in the stored data of VLSI devices, that is, flip-flops, register arrays and Random Access Memories (RAMs). A soft error is caused when a high-energy particle traverses the semiconductor substrate (i.e. silicon), leaving a trail of free charges in its wake. These charges are collected in a very short time interval (about 30 ps) by logic circuitry elements. If the product of capacitance and voltage (i.e. the energy) of the circuit element is low enough, the collected charge may change the stored data. There is no permanent damage to the VLSI device. The circuit will function properly after the event; hence the name "soft error". Radiation-induced soft errors, such as the ones induced by cosmic particles, have been known in the industry for more than 20 years, for example, occuring in dynamic RAMs. It is only recently that the problem has been recognized in VSLI devices when the progress of the integration has led to store data bits in low-energy circuits that can be more easily disturbed.

The implications of soft errors occurring in the logic of a Terabit switching node, and of the errors that may occur on the numerous electrical links necessary to implement it, is that means should be taken to protect against them to keep switching function running error-free. Error correcting codes (ECC) must thus be implemented so the data packets handled at switching nodes are protected while they traverse them.

In the realm of correcting codes, FIRE codes are burst-error-correcting codes and, thus, are well adapted to cope with the kind of errors occurring on the electrical links as described hereinabove (i.e. in bursts spanning several contiguous bits after decoding). They can also take care of the soft errors of the VLSI devices used to implement the switching function since soft errors generally affect a single bit (i.e. a binary latch or a single bit of a RAM). A description of FIRE codes can easily be found in the abundant literature on ECC. Among many examples, one can refer to 'Error Control Coding', a book by Shu LIN and Daniel J. Costello, Prentice-Hall, 1983, ISBN 0-13-283796-X, herein incorporated entirely by reference, and more specifically to Chapter 9 on 'Burst-Error-Correcting Codes'.

If FIRE codes can handle the type of errors as discussed above, it remains that the correction of those errors implies the use of an ECC which must be feasible in a time compatible with the handling of data packets by a switching node. A Terabit per second class switching node of the kind considered here is concentrating and dispatching traffic through a few tenths of ports. Typically, port configurations are generally in the range of 16-port to 64-port. FIG. 1 illustrates a 16-port switch including 16 input ports 100 and 16 output ports 110. The core switching function 120 of a switching node, most often, manipulates small fixed-size data packets 130 including header 131 and data 132. A common size for a data packet is 64 bytes or 512 bits. Port speeds to consider range from 10 to 40 Gbps that is, corresponding either to an OC-192 line of the SONET hierarchy (North American Synchronous Optical NETwork; the European counterpart is called SDH, which stands for Synchronous Digital Hierarchy) for the lower value (10 Gbps) and to an OC-768 for the higher value (40 Gbps). Keeping in mind that switch ports are designed to actually sustain higher values than those quoted above (there is a speedup factor e.g., to provide for the segmentation of protocol frames in fixed-size packets), it can be seen that data packets must enter and exit switch 120 through each port at a rate of one packet every 8 nanoseconds to accommodate OC-768 communication lines with a speedup factor of 1.6 (i.e. with actual switch port speed=40×1.6=64 Gbps). This is the rate (i.e. 64 Gbps) at which ECC must be able to perform corrections in every output port adapter 140.

Very simple circuitry has long been proposed to decode FIRE and similar codes. The well-known standard technique is an error-trapping decoder, an example of which is shown in the above reference book 'Error Control Coding' in section 9.2. Also, improvements have been disclosed. For example, U.S. Pat. No. 5,936,978 dated Aug. 10, 1999 and titled 'Shortened FIRE Code Error-Trapping Decoding Method and Apparatus' describes an improved (faster) error-trapping decoder. Yet simple, error-trapping technique, including all known improvements such as the one of above mentioned patent, assumes that one can afford to shift the pattern of bits received so as to determine where the corrections to perform are (if any). Because the semiconductor technologies that can be used in practice to implement the necessary logic (i.e. CMOS) is now pushed to its limits of operation, the internal clock speed is becoming of the order of magnitude of the time left to handle a packet. Typically, the internal clock period of CMOS ASIC (Application Specific Integrated Circuits) devices can be tuned down to a 2–4 ns range for the fastest of the devices, with logic gate propagation time around 100 picoseconds, while, as stated above, the requirement is to process one 64-byte packet every 8 ns. This makes the state of the art error-trapping technique impractical to use.

Decoding FIRE and similar ECC codes that match the data packet processing speed requirement of Terabit per second switching nodes while still using relatively slow standard technologies like CMOS and not requiring any bit pattern shift is desired.

BRIEF SUMMARY OF THE INVENTION

An object of the present invention is to provide a method for decoding ECC codes such as, for example, FIRE and similar codes, that matches the data packet processing speed requirement of Terabit per second switching nodes while still using relatively slow standard VLSI technologies such as, for example, CMOS.

Another object of the present invention is to provide a method for decoding FIRE and similar codes that does not require any bit pattern shift.

It is a further object of the present invention that the decoding can be completely performed with combinatorial logic.

These and other related objects of the present invention are achieved by a method for decoding a d-bit syndrome of FIRE and similar codes, said syndrome obtained from the checking of a message or data packet encoded according to a degree-d generator polynomial characteristic of said codes, said degree-d generator including a factor from which a Galois Field (GF) can be built, said method comprising the steps of:

splitting said syndrome into sub-syndromes including at least a left sub-syndrome (LSS) and a right sub-syndrome (RSS) on the basis of the structure of said generator polynomial;

combining said sub-syndromes to form at least one kind of error pattern;

picking from said at least one kind of error pattern an error pattern (EP), said picking step including, if necessary, the further steps of:

picking the narrowest error pattern among said at least one kind of error pattern;

selecting accordingly a mode of correction;

determining from said picked error pattern if an uncorrectable error is detected; and decoding from said at least left sub-syndrome and right sub-syndrome if errors are confined within first d-bit of said message or data packet.

The method further includes the steps of correcting errors within said message or data packet, said method further comprising the steps of:

picking said left sub-syndrome or said right sub-syndrome depending on what mode of correction has been selected;

determining rank of said picked sub-syndrome in said Galois field;

determining rank of said picked error pattern in said Galois field;

subtracting, modulo the length of said Galois field, from the rank of said picked sub-syndrome the rank of said picked error pattern thereby, obtaining a group first vector (GFV), said subtracting step optionally including the further step of:

zeroing said GFV if said uncorrectable error has been detected or if errors are confined within said first d-bit of said message or data packet;

decoding whether said GFV matches with a group corresponding to said mode of correction, said decoding step optionally including the further step of:

forcing a match if errors are confined within said first d-bit of said message or data packet;

if a match is found:

applying said error pattern to said group thereby, correcting the errors; or if no match is found:

further detecting an uncorrectable error.

Further objects, features and advantages of the present invention will become apparent to ones skilled in the art upon examination of the following description in reference to the accompanying drawings. It is intended that any additional advantages be incorporated herein.

DETAILED DESCRIPTION OF THE INVENTION

The description that follows uses a particular FIRE code to illustrate how this class of burst-error-correcting codes can be, in general, decoded according to the method of the present invention (i.e. without requiring any pattern shift or sequential logic). The selected FIRE code chosen to illustrate the present invention corresponds to the type of applications discussed in the background section. Hence, the selected FIRE code is aimed at allowing the protection of short packets as it is defined in the description of the present invention (i.e. about 64-byte packets) and capable of correcting errors occurring at most in 5-bit bursts so as to cope with the kind of errors resulting from the decode of a 8B/10B encoded multi-gigabit transmission link. Those skilled in the art that know how FIRE codes must be constructed to obtain these properties will recognize, from this particular example, how the present invention can be practiced to match different applications. For example, the size of the packets and the length of correctable bursts could be very different while still practicing the present invention.

Figure 2:
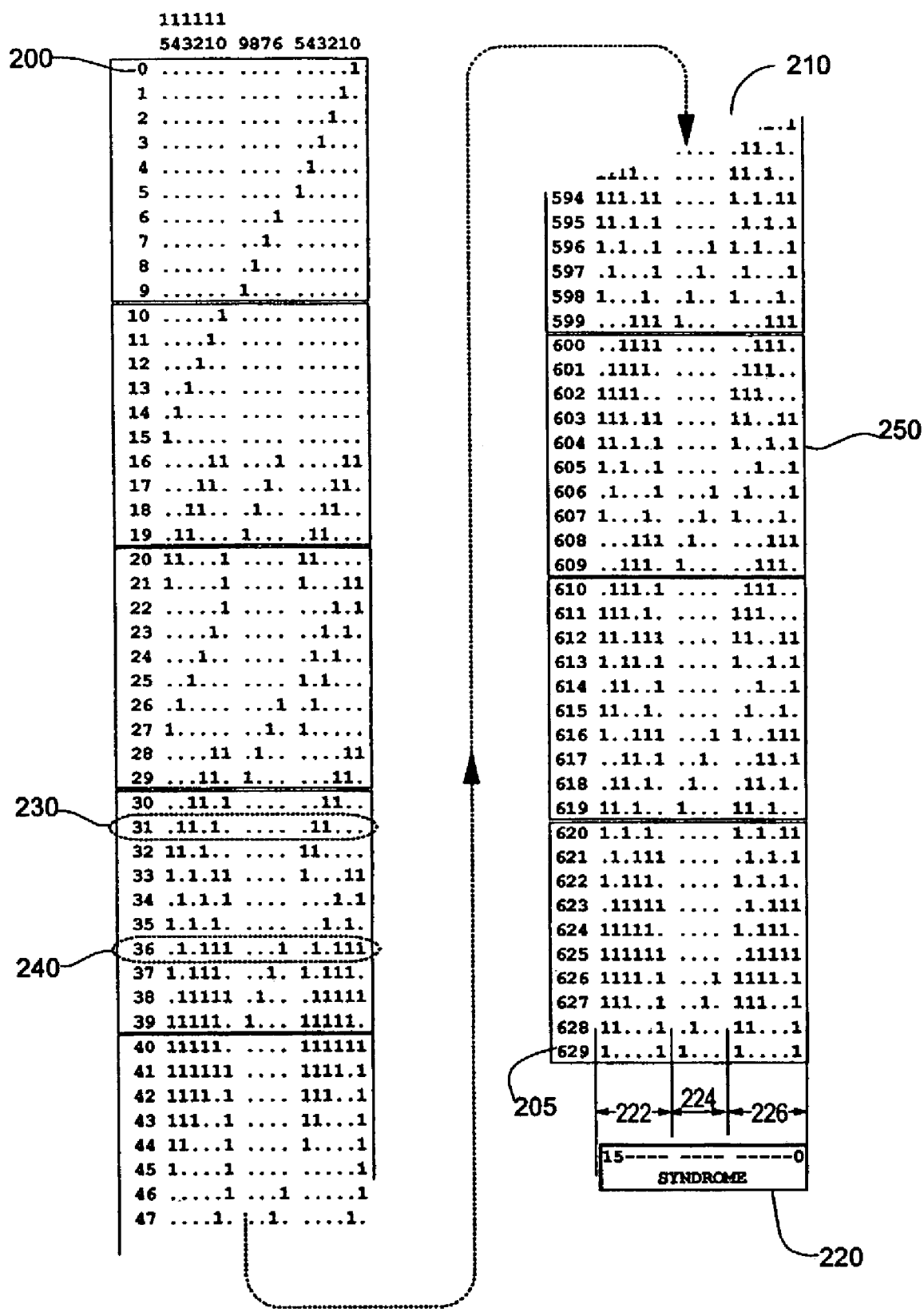
FIG. 2 illustrates the beginning and the end of a series of 16-bit binary vectors forming the H matrix of the FIRE code used to illustrate the method of the present invention, allowing generation of a 16-bit syndrome.

FIG. 2 shows the beginning and the end of a series of 16-bit binary vectors ranked from 0 (200) to 629 (205). For the sake of readability, the binary vectors shown here and in the rest of the description, when appropriate, are shown using a '1' symbol to represent a binary one value and a dot '.' to represent a binary zero value. The 630 vectors form a multiplicative group in an algebra modulo 2, modulo G(X), where G(X) is the following generator polynomial:

$$G(X)=X^{16}+X^{11}+X^{10}+X^{6}+X^{1}+1$$

which actually defines a degree-16 (2-byte) FIRE code. This FIRE code polynomial, like all codes pertaining to this class of codes, is actually the product of two polynomials, which are, in this case:

$$G(X)=(X^{10}+1)(X^{6}+X^{1}+1).$$

The right polynomial is a primitive, irreducible, polynomial of degree 6. A list of such polynomials can be found in 'Error Correcting Codes', Peterson & Weldon, 2nd edition, the MIT press, 1972, ISBN: 0262160390. herein incorporated entirely by reference. The irreducible polynomial (i.e.: $X^6+1$) is referred to in the rest of the description as G103 (because '103' is the octal notation of this polynomial as listed in the above reference). And, since, it is primitive and irreducible, G103(X) can generate a Galois Field (GF) of maximum length, i.e.: $2^6-1=63$. Hence, the length of the FIRE code obtained from it after multiplication by the left factor ($X^{10}+1$) is $10 \times 63 = 630$. FIG. 2 table (210) displays part of the 630 16-bit vectors forming the so-called H matrix of this particular code. H matrix is the convenient way of defining an error-correcting code. Especially, the H matrix allows generation of a 16-bit syndrome (220) resulting in the checking of a packet so it can be recognized as error-free (because the syndrome is all-zero) or the error can be corrected as a result of the decoding of the syndrome which is the scope of the present invention, As an example, if a single-bit error is present in a packet at rank 31 (230) the syndrome is '0110100000011000' which is a correctable error. While if two errors affect bits 31(230) and 36 (240), the syndrome is the sum modulo 2 (noted ⊕) of the two corresponding vectors. Namely:

'011010 0000 011000'⊕'010111 0001 010111'='001101 0001 001111' which will be recognized as an uncorrectable error (UE) since, if only two bits are affected i.e., less than the 5 bits that this burst correcting code can handle, they are however 6-bit apart which is beyond what the code can do. Detection of UE's is discussed hereinafter with reference to FIGS. 6 and 10.

As suggested by the representation of the vectors and syndrome shown in FIG. 2, the present invention considers the syndrome as composed of three parts. That is, a 6-bit left sub-syndrome LSS (222), a 4-bit middle sub-syndrome MSS (224) and a right sub-syndrome RSS (226). Also, one can easily notice that the 630 vectors can be divided in 63 groups, such as, for example (250), of 10 vectors each. Those two numbers corresponds respectively to the length of the GF based on polynomial G103 (X) and to the power of the left multiplying factor, here $X^{10}+1$, used to obtain the FIRE code polynomial of this exemplary description of the present invention. All FIRE codes are built in this way so a similar breakdown of the matrix and syndrome can always be done. The number of groups, size of the groups and size and the sub-syndromes will vary according to the particular chosen polynomial though. One must notice that LSS and RSS are of the same size: 6 bits, which corresponds to the power of the right irreducible polynomial used to obtain the FIRE code polynomial.

Figure 3:
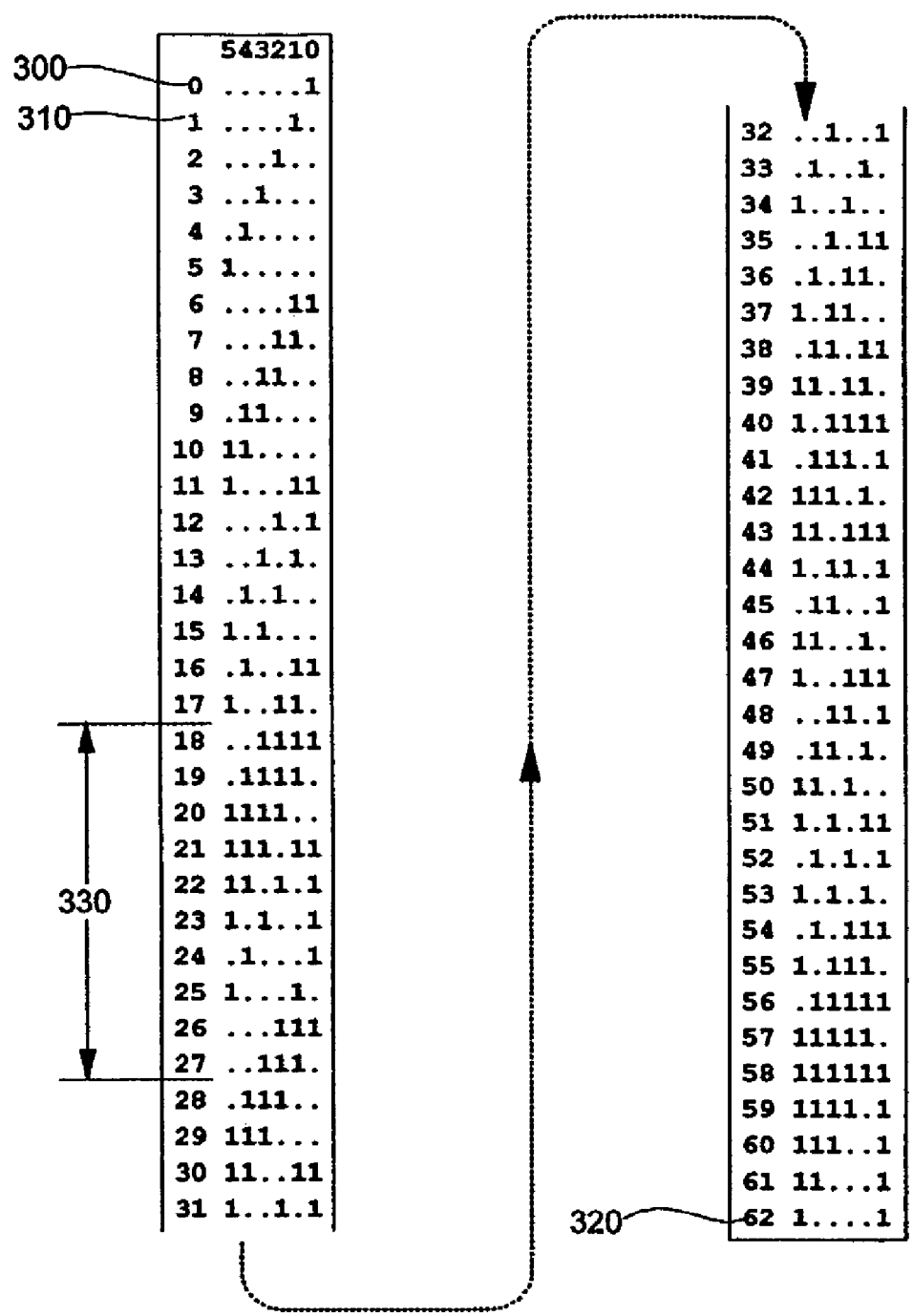
FIG. 3 illustrates the Galois Field generated with the irreducible polynomial factor of the FIRE code used to illustrate the method of the present invention.

FIG. 3 shows the 63 vectors composing the finite field or Galois Field (GF) generated with $G103(X)=X^6+X^1+1$ or, in binary notation, the 7-bit vector '1 . . . 11'. The 6-bit vector at rank 0. i.e.: $\alpha^0$ (300), is the identity vector of the multiplication. All vectors can be obtained by successive multiplications (noted ⊗ $\alpha^1$) of the next vector at rank 1, that is, $\alpha^1$ (310) so that $\alpha^2=\alpha^1=\alpha^{1+1}=\alpha^2$, and so on, up to $\alpha^{62}$ (320) which, when multiplied in turn by α1, returns the identity vector (300) since the multiplication is true modulo the length of this finite field (i.e. 63 in this particular example):

$$\alpha^a \otimes \alpha^b = \alpha^{a+b \ modulo \ 63}$$

Again, all operations on these binary vectors are performed modulo 2, modulo G103(X), so that all resulting vectors have at least one bit less than the 7-bit binary vector representation of G103(X).

At this point it is worth noting that the 630-vector H-matrix of FIG. 2, characterizing the FIRE code used to illustrate the present invention, was built in a similar fashion, that is, through a series of multiplication. Although G(X) is not irreducible, it allows however, formation of a finite multiplicative group of 16-bit vectors in which the following holds:

$$\alpha^a \otimes \alpha^b = \alpha^{a+b \ modulo \ 630}$$

The fact that this is a group, rather than a field, which is thus formed (in the mathematical sense of these terms) means that modulo 2 addition of vectors does not necessarily return a vector belonging to the multiplicative group, while in a field, like the GF of FIG. 3, both vector multiplication and vector addition are indeed possible. This property of GF will be used later on.

Having thus generated the GF corresponding to the irreducible factor G103(X) of the FIRE code polynomial G(X), referring again to FIG. 2, it is now possible to notice that, in each group of 10 patterns such as (250), the 6-bit left part of the 16-bit vectors, corresponding to LSS (222), are made of a series of consecutive vectors of the GF in FIG. 3. More specifically, the 6-bit left part of the 10-vector group (250) is comprised of 10 successive GF vectors (320), ranked from 18 to 27 i.e., $\hat{1}\pm^{18}$ to $\hat{1}\pm^{27}$, for this 10-vector group (250). A similar structure is true in all the 10-vector groups but the first one.

As far as the 16 first vectors of the H-matrix shown in FIG. 2 are concerned, the first vectors need to be treated apart. In fact, decoding of errors corresponding to the first 16 vectors is trivial since they form a diagonal matrix. This will be discussed later on. Until then, only the decoding of the other 'regular' 614 vectors is considered unless it is explicitly otherwise noted.

Figure 4:
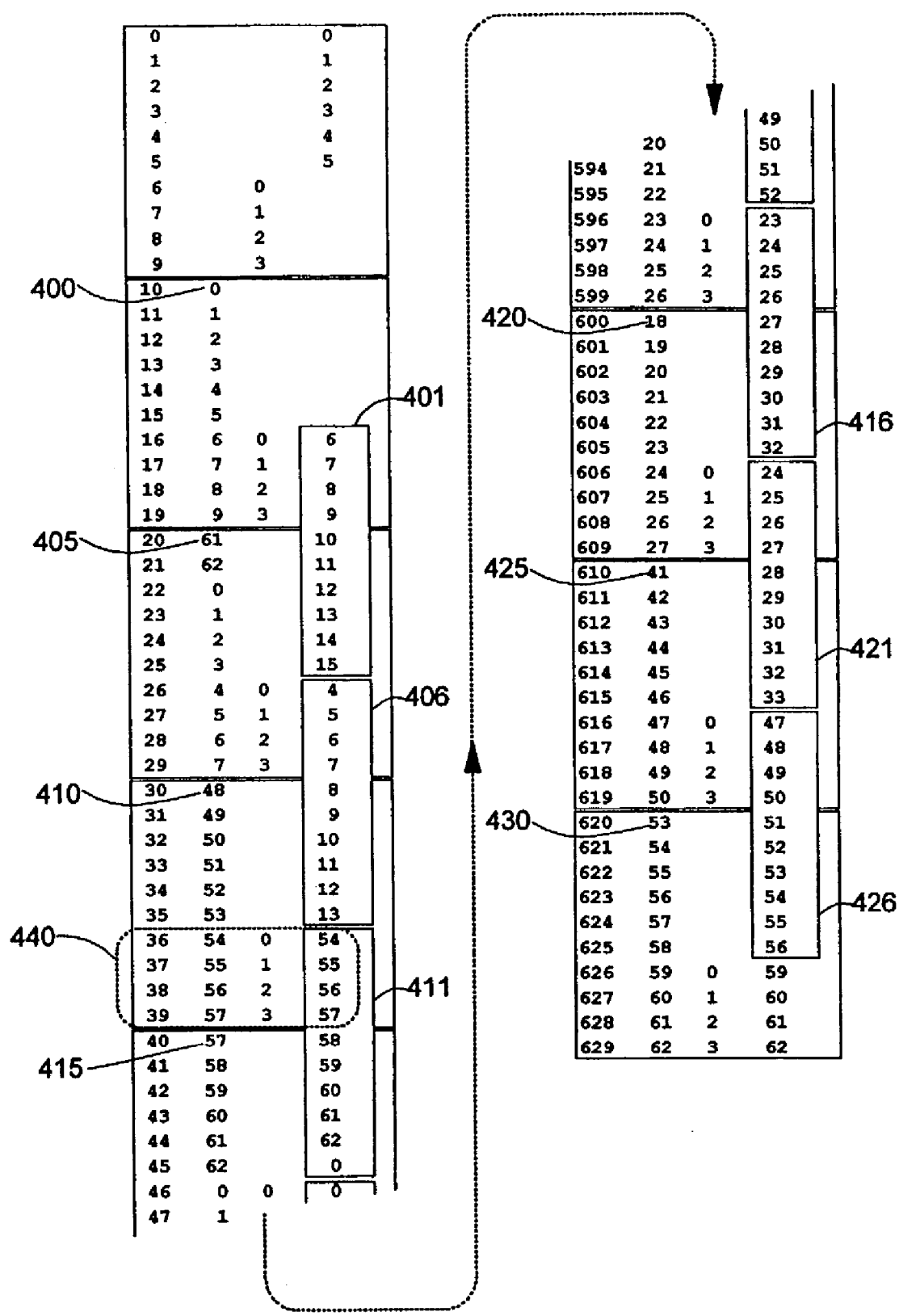
FIG. 4 represents another view of FIG. 2 wherein the 6-bit left part, the 4-bit middle part and the 6-bit right part are listed under the form of their ranks in the Galois Field of FIG. 3.

FIG. 4 is another view of FIG. 2 on the basis of the remark done in FIG. 3. Rather than listing the 630 binary vectors under the form of 0 and 1, the 6-bit left part, the 4-bit middle part and the 6-bit right part of the 16-bit vectors (corresponding respectively to LSS, MSS and RSS) are listed under the form of their ranks in the GF of FIG. 3 when applicable (blanks correspond to an all-zero 6-bit or 4-bit vector which has no rank as far as the multiplication is concerned). This reveals more of the structure of the code.

First, one must notice by examining all 10-vector groups that the rank of the first 6-bit left vector is different in each group. The first 6-bit left vectors shown in FIG. 4 are (400), (405), (410), (415), (420), (425) and (430). This can be verified on an exhaustive list (not shown) of the 630 16-bit vectors. This comes from the fact that one rule to build a FIRE code imposes that the length of the field built with the right factor, here G103(X), having a length of 63, must be relatively prime with the exponent of the left factor ($X^{10}$+1) so that code length is their LCM (Least Common Multiple), i.e. 63×10=630. Hence, the first 6-bit left vector characterizes the 10-vector group to which it belongs. And, as already noticed, the 9 following 6-bit left vectors are the vectors in sequence of the GF shown in FIG. 3.

Second, shifted 10-vector groups can be formed as well on the basis of the right 6-bit vector (corresponding to RSS). The same structure as for the left 6-bit vectors is found. That is, the first 6-bit right vector is indicative of the shifted 10-vector group to which it belongs. There are 6 such shifted 10-vector groups shown in FIG. 4 namely, (401), (406), (411), (416), (421) and (426).

Third, the middle 4-bit vector is not null only where the 10-bit vector groups and the shifted 10-bit vector groups overlap and where the 6-bit left vectors and the 6-bit right vectors are equal as shown, for example, in area (440).

Figure 5:
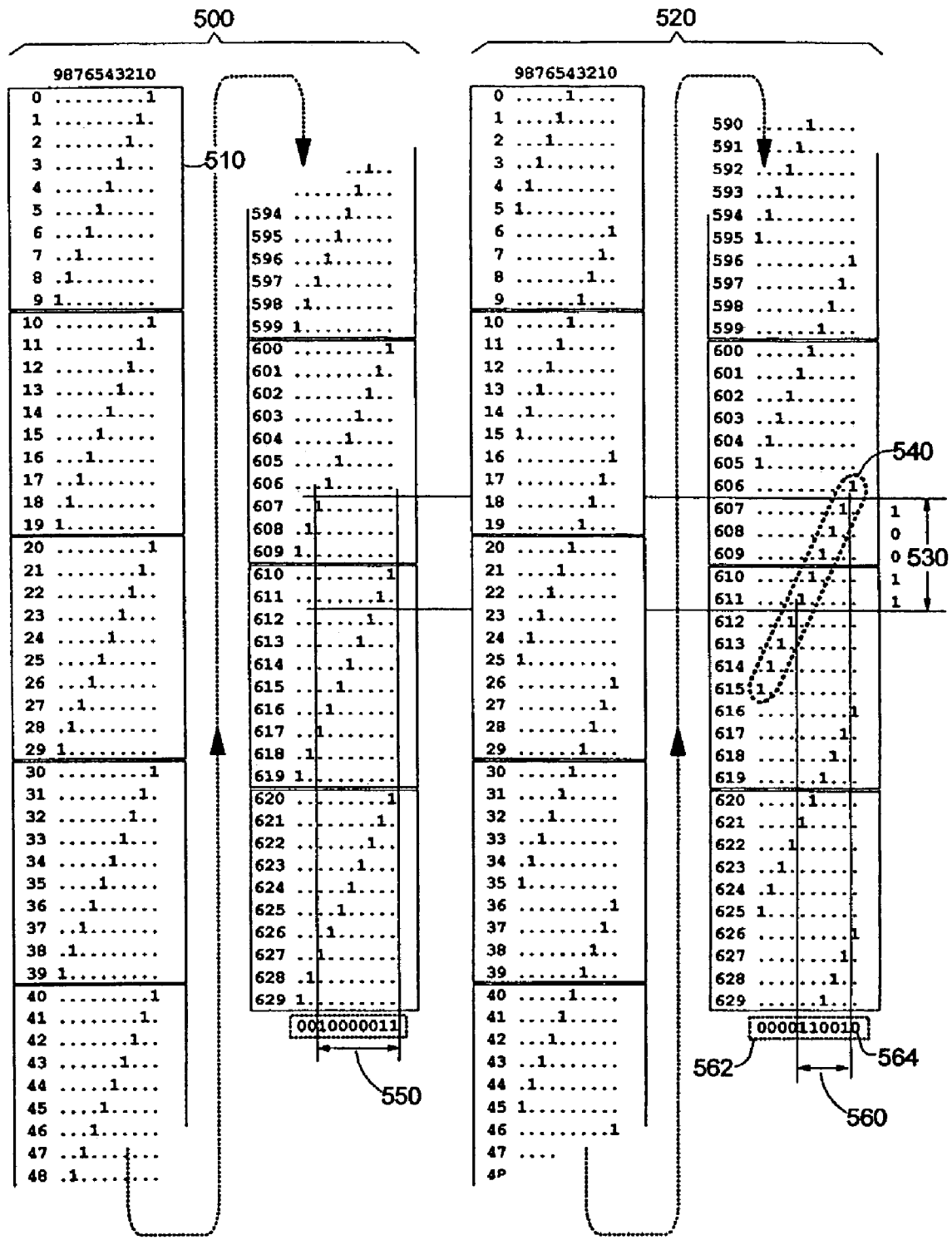
FIG. 5 illustrates two series of 10-bit binary vector showing transformations performed on the 16 bits of each binary vector of FIG. 2 so as to obtain the error pattern.

FIG. 5 illustrates further analysis of the structure of FIRE codes so they can be simply decoded. The left half of FIG. 5 (500) displays part of the 10-bit patterns P(R) (where R is rank of pattern in a range 0–629) obtained from the application of the following transformation on each of the 630 16-bit vectors of H-matrix of FIG. 2, with vector bits indexed from 15 to 0, left to right i.e., from most significant bit (MSB) to least significant bit (LSB):

$$P(R,9–0)=H(R,9–6) \ , \ H(R,15–10) \oplus H(R,5–0)$$

That is, each 10-bit pattern is formed from the concatenation of the middle 4-bit vector with the XOR (addition modulo 2), noted $\oplus$, of the two 6-bit vectors (left and right). Thus, one gets the simple series of 10-bit diagonal matrices such as (510) that are aligned with the 10-bit vector groups.

Similarly, as shown in the right half of FIG. 5 (520), patterns are formed according to following alternate transformation:

$$P(R,9–0)=H(R,15–10) \oplus H(R,5–0), \ H(R,9–6)$$

Then, one gets an equivalent series of 10-bit diagonal matrices aligned however, in this alternate case, with the shifted 10-bit vector groups as discussed with reference to FIG. 4.

Therefore, this allows generation of an error pattern which is assumed not to span over more bits than the size of the 10-vector groups, hence is potentially correctable if it does not exceed the actual burst-correcting capability of the code i.e., 5 bits in this particular example of the present invention.

Burst-correcting capability is a priori known from the theory of FIRE codes. If L is the maximum length of the burst of errors to correct, then the degree of the right irreducible polynomial ($X^6$+$X^1$+1), i.e. 6, must be equal to or larger than L. A second condition to meet is that the power of the left polynomial ($X^{10}$+1), i.e. 10, must be equal to or larger than 2L–1. Indeed, 5 meets both conditions, while 6 would fail the second condition in this particular example of a FIRE code.

Hence, a correctable burst error, encompassing at most 5 consecutive bits, always fits completely in, at least, one of the group of patterns as formed in FIG. 5 allowing to indeed get the corresponding error pattern as further discussed with reference to FIG. 6. This is illustrated here with the case of a burst of errors '11001' encompassing bits ranked 607–611 (530) that fits completely in a shifted group of patterns (540). The left part cannot be used since the burst overlaps two groups, thus returning a wrong wider spreading of the 1's in the 10-bit error pattern '0010000011' (550), while the right pattern is indeed correct '0000110010' (560).

Having analyzed the FIRE code used in FIGS. 2 to 5 as an example to illustrate the present invention, it is now possible to explain how the FIRE code can be decoded and 5-bit burst corrections performed. It should be noted that it is not the purpose of the present invention to discuss how a syndrome can be generated. Many methods and apparatus known from the art can be used depending on the the type of application considered. Again, the present invention is directed at the decoding of the syndrome without requiring any sort of shifting or sequential state machine to be carried out.

Figure 1:
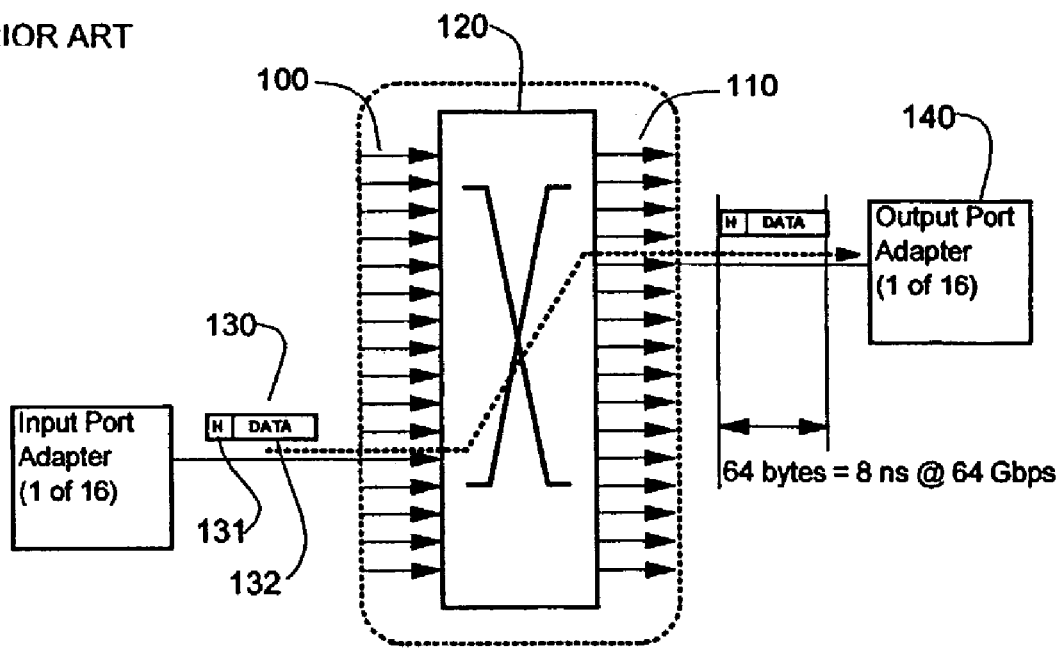
FIG. 1 illustrates a standard 16-port switching device for transmitting small fixed-size data packets.
Figure 6:
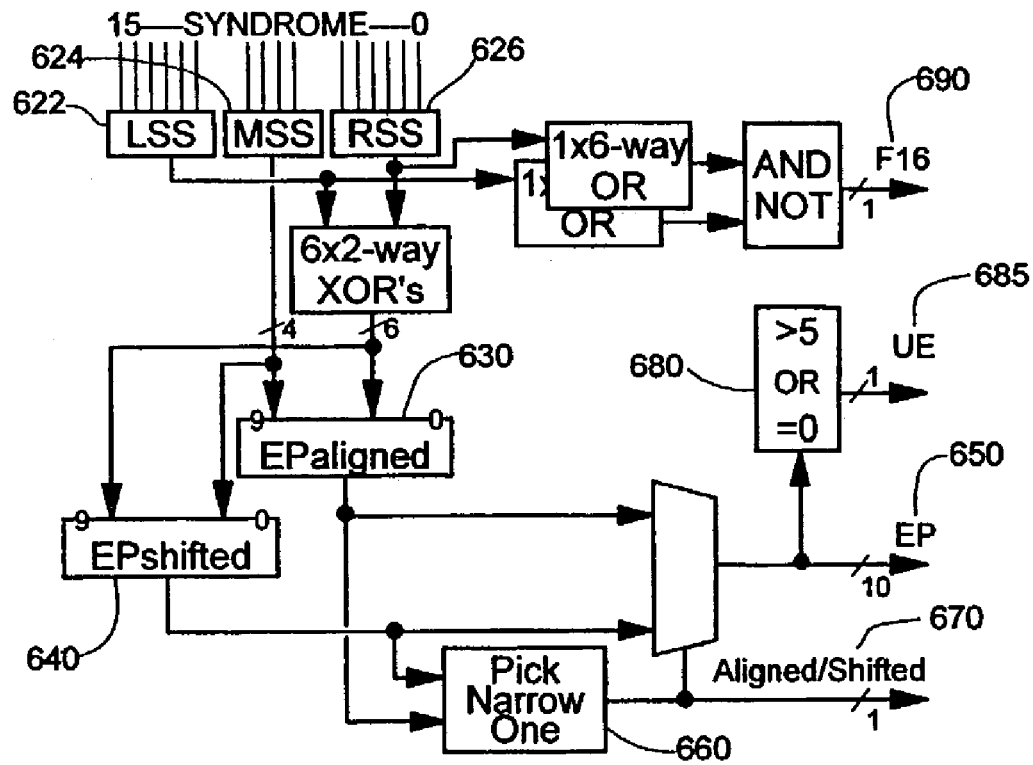
FIG. 6 is a schematic diagram of a circuit used to derive a 10-bit error pattern from sub-syndromes including the 6-bit left part, the 4-bit middle part and the 6-bit right part of a 16-bit syndrome.

FIG. 6 further illustrates how an error pattern can be derived directly from the sub-syndromes LSS (622), MSS (624) and RSS (626). In the following, Error Pattern (EP) is a 10-bit vector, indexed 9–0, where 1's show where errors are located in a span of 10 consecutive bit positions. Those ten consecutive positions match either the 10-vector groups or the shifted 10-vector groups. Then, as described hereinabove, especially with reference to FIG. 5, either of following holds:

$$EP\text{aligned}(9\text{–}0)=MSS,LSS\oplus RSS(630)$$

OR $$EP\text{shifted}(9\text{–}0)=LSS\oplus RSS, MSS(640)$$

The one to retain is simply the narrowest one (the one in which the 1's indicative of the bits in error are less spread) since, if EP spans over two 10-vector groups, as shown in FIG. 5 (550), the error pattern thus obtained is wrong and wider than the good one obtained from the other 10-vector group. Obviously, both could be useable if the burst of errors does neither span over two 10-vector groups nor over two shifted 10-vector groups. In which case both error patterns are equivalent thus, either one can be picked to proceed with the decoding. Whichever EP (650) is picked (660) from a 10-vector group or a shifted 10-vector group, this is explicitly decoded (670) since this information must be further used to locate the errors as will be explained with reference to FIG. 7a.

Whenever the narrowest EP is found spreading over more than 5 bits, an Uncorrectable Error (UE) is found (685). This must prevent any correction and must be reported so that appropriate actions can be taken such as a discard of the corresponding packet. The burst of errors is beyond what error correction code can correct in this case. Another case that must be reported as UE is when EP is an all-zero vector. This is very possible only if the burst of errors is beyond what the code can handle, i.e. when many errors are spreading over much more than 5 bits. In this case, due to the many combinations of vectors producing the syndrome, it is possible to get LSS=RSS with MSS='0000' which indeed gives an all-zero EP vector. Clearly, this case is also an UE. Hence, an UE is decoded (680) whenever a burst of errors is found to spread over more than 5 bits and if EP is all-zero (when, obviously, syndrome is different from 0).

Also, the analysis of the sub-syndromes allows for simply distinguishing errors that occur in positions 0–15 corresponding to the 16 first vectors of the H-matrix shown in FIG.-2. When errors are confined to the first d-bit positions, corresponding to the degree d of the polynomial, here referred to as F16 in this particular example of a degree-16 polynomial, the following is true (690):

$$F16=\text{NOT } (LSS \text{ is NOT '000000'}) \text{ AND } (RSS \text{ is NOT '000000'})$$

AND and NOT are the boolean operators. This is necessary to perform the corrections occurring in the first 16 bits for which the structure of the vectors forming the H-matrix is different than all of the others as seen in FIGS. 2 and 4. F16 is used in FIG. 9 to perform the correction of the first aligned and shifted groups.

Figure 7A:
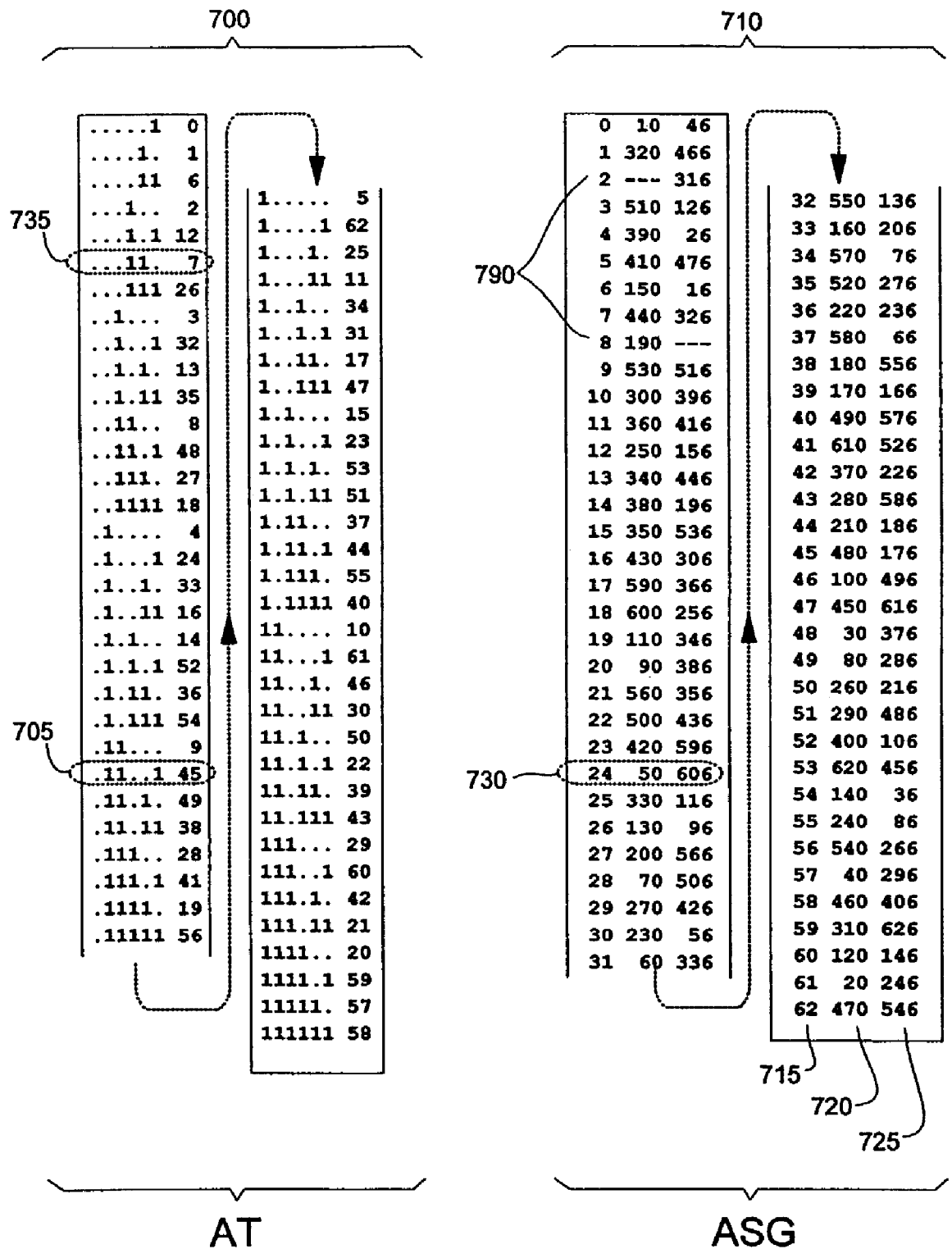
FIG. 7*a* illustrates a first series of 6-bit binary vectors corresponding to the Galois Field vectors of FIG. 3 that are ordered according to their binary weight and a second series that lists, for each Galois Field vector of FIG. 3, the positions where it appears as a first vector of a 10-vector group as illustrated on FIG. 4.

FIG. 7a illustrates how, once the pattern of errors has been extracted from the syndrome, its position can be determined so as a correction can be applied to the content of a data packet.

First, one must determine the rank of the vector that the error pattern generates in the GF obtained with the irreducible polynomial G103(X). All vectors of this GF are shown in FIG. 3. More precisely, in the 10-bit error pattern, this is only the field starting and ending with a 1, i.e. the burst of errors (noted BEP for burst-error-pattern in the following), that must be considered first. An example of which is shown in FIG. 5 (560). As already mentioned, the size of the correctable burst cannot be larger than the degree of the irreducible polynomial used to build the FIRE code i.e., 6 with G103 (X). Then, a 63-entry table of the ranks of these vectors, as they appear in the GF shown in FIG. 3, must be prepared even though, only the 31 ($2^5$–1 and not $2^6$–1) first entries are actually needed as far as BEP is concerned since, as already noticed, in the particular example of the FIRE code used to illustrate the present invention, the maximum size of a correctable burst of errors is 5 (not 6) because the degree of the left multiplying factor ($X^{10}$+1) also imposes a limitation on the maximum correctable burst size.

Thus, the 63 6-bit vectors of the GF are sorted according to their binary weight (most significant bit left) so as BEP can be used as an entry to the lookup table (700) shown in FIG. 7a. Lookup table (700) allows the rank of the GF vector corresponding to the 5-bit BEP to be found. Still using the example of FIG. 5, where BEP='11001' (560), $\hat{1}\pm^{45}$ (705) is returned by lookup table (700). Thus sorted, th lookup table (700) is actually the addition table of this GF since it allows solving of the following expression, and any such expression in general:

$$BEP=\alpha^4\oplus\alpha^3\oplus\alpha^0=\alpha^{45}$$

Hence, lookup table (700) is referred to as Addition Table (AT) throughout the rest of the description. The vector rank (705) returned by the interrogation of AT allows the retrieving of the 10-vector group, aligned or shifted, in which the burst of errors is totally confined.

A second lookup table (710) must also be considered. It lists, for each GF vector in range 0–62 (715), where they appear as a first vector of a 10-vector group, aligned and shifted. This is also a 63-entry table, referred to as ASG (Aligned/Shifted Groups), of all the ranks in range 0–629 of the multiplicative group of FIG. 4, where a particular GF vector is found in first position of a 10-vector group. The middle values (720) are the ones for the aligned 10-vector groups while the right values (725) are those of the shifted groups. As an example, referring to FIG. 4, $\hat{1}\pm^{24}$ is the first vector of the shifted group (421). Then, at entry 24 (730) of ASG the right returned value is 606, i.e. the rank of this shifted group in the 630-vector multiplicative group of FIG. 4. Use of the middle or right values depends on the result of the analysis of the syndrome as explained in FIG. 6 where it is determined whether aligned groups and LSS or shifted groups and RSS must be selected. With the particular example used throughout the description of the present invention, this is the shifted groups and the right values which must then be used since BEP is confined to a shifted group.

Then, BEP, expressed as a vector of the GF, i.e. $\hat{1}\pm^{45}$, must be altered so as it is repositioned within the 10-vector group to which it is completely confined. In other words, depending on the number of 0's found at the right of BEP, in the 10-bit EP from which BEP was extracted, a corresponding multiplication must be applied. Since one 0 is found in this particular example, a multiplication by $\hat{1}\pm^1$ ('10' in binary) must be done. Above is shown in FIG. 5, (562) and (564). If none were found the multiplication would have been done by $\hat{1}\pm^0$ ('1' in binary, the identity element of the multiplication). Up to nine 0's could be found, in the case of a single-bit error at bit position 9 of EP, requiring a multiplication by $\hat{1}\pm^9$. Thus, in the particular chosen example, the repositioned value of BEP, i.e. BEPr, is:

$$BEPr=\alpha^{45}\oplus\alpha^1=\alpha^{46}$$

Finally, RSS must be used to identify in which of the shifted groups the burst of errors is. Referring to FIG. 2, RSS (part of the syndrome result of checking of a data packet) can easily be deduced for this particular example where the bits 607, 610 and 611 are assumed to have been altered as shown in FIG. 5 (530). It is the sum of:

$$RSS=\text{'100010'}\oplus\text{'011100'}\oplus\text{'111000'}=\text{'000110'}$$

Knowing RSS, its rank can be obtained directly from the interrogation of AT (700) like with BEP. Using AT again, at entry '000110' (735), 7 is found, thus, RSS=$\hat{1}\pm^7$. And, because each 10-vector group is made of 10 consecutive vectors from the GF, the following holds (GFV stands for Group First Vector and corresponds to what is remembered in the ASG table):

$$RSS=BEPr \otimes GFV$$

Thus, GFV, the first vector of the group to which error burst is confined, is:

$$GFV=RSS\oplus BEPr^{-1}$$

where $BEPr^{-1}$ is the invert of BEPr ($BEPr^{-1} \oplus^{BEPr}=1$) which, in this example, translates as follows:

$$GFV=\alpha^7 \otimes \alpha^{-46}=\alpha^7 \otimes \alpha^{63-46}=\alpha^7 \otimes \alpha^{17}=\alpha^{24}$$

Hence, the interrogation of ASG at address 24 (730), the rank of found GFV, returns 50 and 606. The right value is retained since it corresponds to RSS. It is indeed the rank of the shifted group in which error burst is confined as shown in FIG. 5 (540). Therefore, errors can be corrected.

An example of an implementation of this is shown in FIG. 7a. This requires only simple standard logic and techniques well-known from the art. Those skilled in the art, i.e. logic designers, know how to implement the logic functions depicted in FIG. 7a that are necessary to carry out the present invention. AT (700) table is preferably implemented in a small hard-coded ROS (Read Only Storage) available in most ASIC's especially, because this type of device cannot be disturbed by the soft-error mechanism discussed in the background section. AT is duplicated in two ROS (745) (740) so as implementation can be fully combinatorial. Then, depending on what has been decoded in FIG. 6, i.e. aligned or shifted (750), LSS or RSS is selected (755) to address AT#2 (745). The result of this interrogation is the decimal rank (0–62) of LSS or RSS in the GF generated by G103(X).

Simultaneously, BEP is extracted (760) from the 10-bit EP vector as generated in FIG. 6. Here, BEP is a 1-bit (single-bit error) to 5-bit vector (762) corresponding to the correctable burst of errors. Again, as already discussed, the maximum burst of correctable errors could be as high as the degree of the irreducible polynomial G103 (X), i.e. 6 in this example. However, burst correcting capability is also limited by the particular left multiplying factor, $X^{10}+1$ in the example of the description of the present invention, which actually limits the burst correcting capability to 5. Thus, in the general case, AT#1 (740) must contain all vectors of the GF, 63 in this example. Logic that extracts BEP (760) must also count the the number of 0's to the right of BEP in 10-bit EP. This was illustrated in FIG. 5 (564). The purpose of it is to compute the rank of BEP as it would be positioned in the first 10-bit vector of the GF ($\hat{1}\pm^0$ to $\hat{1}\pm^9$) thus, in a manner similar to the aligned or shifted 10-vector groups. Because the minimum error burst is when a single bit is affected there could be up to nine right zeroes to add, which is encoded on 4 bits (764). Then, the repositioned BEP i.e., BEPr (752) is the sum (750), modulo the length of the GF (i.e.: 63) of the rank of BEP (742) and of the displacement or rank of BEP within the first 10 elements of the GF.

Finally, by comparing the ranks of LSS or RSS (747) with the rank of the error pattern (BEP) positioned in a 10-bit vector, i.e. BEPr (752), it is possible to obtain the rank of the first vector of the group, i.e. GFV (772), to which error pertains. This must be done by subtracting, modulo 63 (770), from the rank of the sub-syndrome (RSS or LSS) the rank of the error (BEPr). Thus, calculated GFV allows unambiguous selection of the group to which the burst of errors is confined and can be corrected. This is further discussed with reference to FIG. 8.

All of this holds if the burst of errors fits within the model of errors assumed to be correctable by the FIRE code used as an example in the description of the present invention. However, if an UE has been detected or if the burst of errors is found to be confined within the first 16 bits as explained in FIG. 6, the corresponding signals, i.e. UE and F16 (780), must be used to force the output of subtractor (770) to take the all-zero value '000000' which does not correspond to any pattern of the GF, thus, is not detected by the logic of FIGS. 8 and 9 described hereinafter.

Those skilled in the art will recognize that many variations could be brought to the way the present invention is implemented and still fully practice it. As a simple illustration of this, part of the logic including AT#1 and used for analyzing EP (765) could be replaced by a 1024-entry lookup table. The lookup address would be the 10-bit error pattern (768) returning directly the 6-bit value of BEPr (752). Yet necessitating a larger lookup table in this way simplifies the logic which no longer requires the adder (750) and the logic to extract BEP (760).

Figure 8:
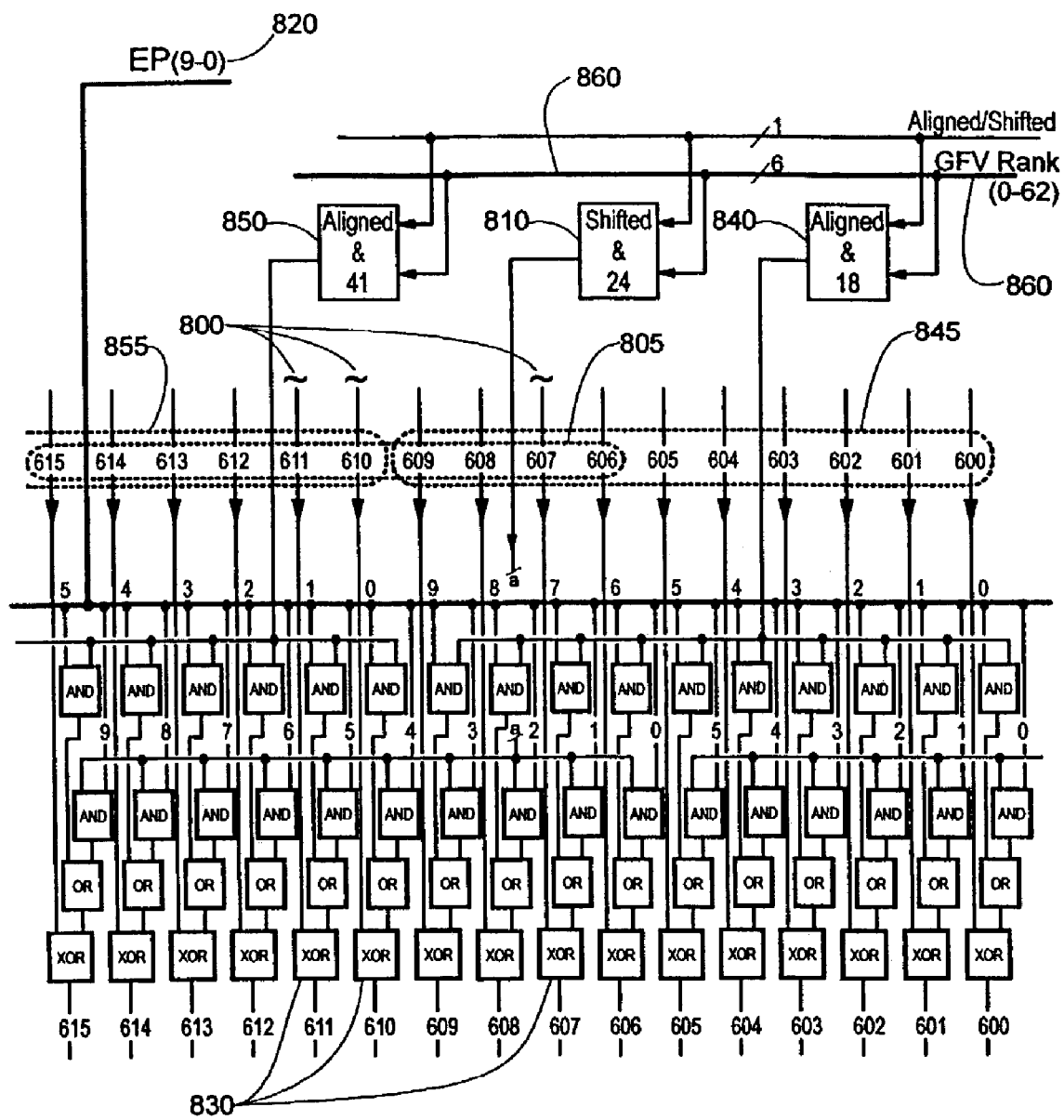
FIG. 8 illustrates a portion of a combinatorial circuit used to correct a burst of errors after the group to which the burst of errors is confined has been determined.

FIG. 8 illustrates that once GFV is known, GFV can be used to correct the burst of errors. FIG. 8 depicts only a small part of the logic necessary to perform the corrections which is, however, similar for all the bits and groups not shown. Again, FIG. 8 illustrates the example used throughput the description of the present invention. Bits 607, 610 and 611 (800) are assumed to have been altered (i.e. a 0 has been turned into a 1 or the opposite). Then, the shifted group starting at rank 606 (805) is selected because rank '24' and 'shifted' state are decoded (810). The 10-bit error pattern bus EP(9–0) (820), applied to all 10-bit groups, allows for performing the correction on the selected group resulting in the inversion of bits 607, 610 and 611 by the corresponding XOR's (830). FIG. 8 also shows the decoding block (840) corresponding to the aligned group starting at rank 600 (845) in which case vector of rank 18 in the GF must be decoded. Also shown is the decoding (850) of the next aligned group starting at rank 610 (855) with GF vector of rank 41. As shown in ASG table of FIG. 7a, each vector of the GF is used at most once for an aligned group and a shifted group so decoding of the first vector of the group is unambiguous for selecting a group (aligned or shifted) to which correction must be applied. Hence, for this exemplary implementation of the invention, ASG table of FIG. 7a is not actually implemented under the form of a lookup table (e.g. in a ROS like AT) but is rather spread over a series of decoders such as 810, 840 and 850 uniquely selecting an aligned or a shifted group depending on what GFV rank (860) has been calculated as was explained with reference to FIG. 7a.

Figure 7B:
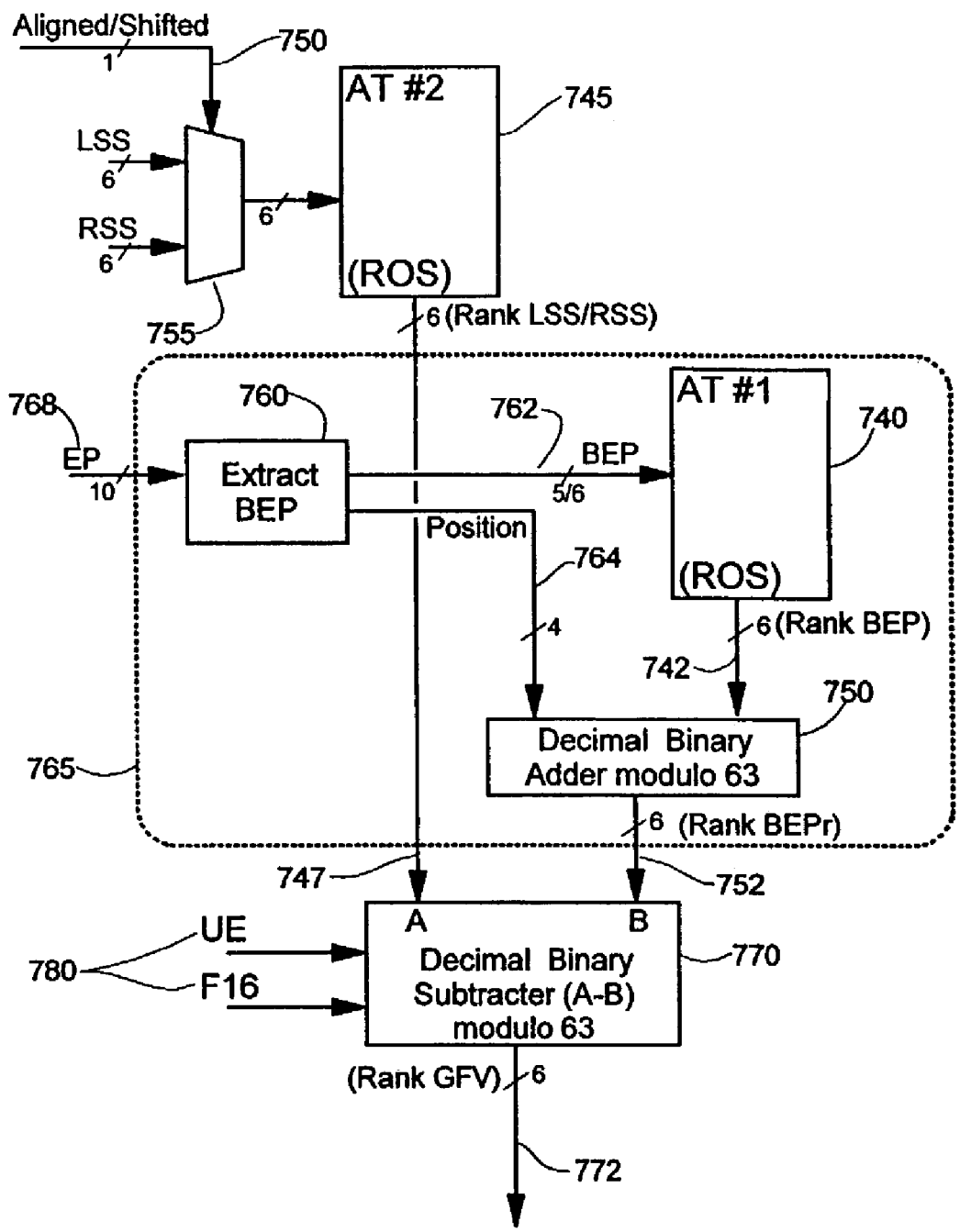
FIG. 7*b* is a schematic diagram of a circuit used to determine the group to which the burst of errors is confined.
Figure 9:
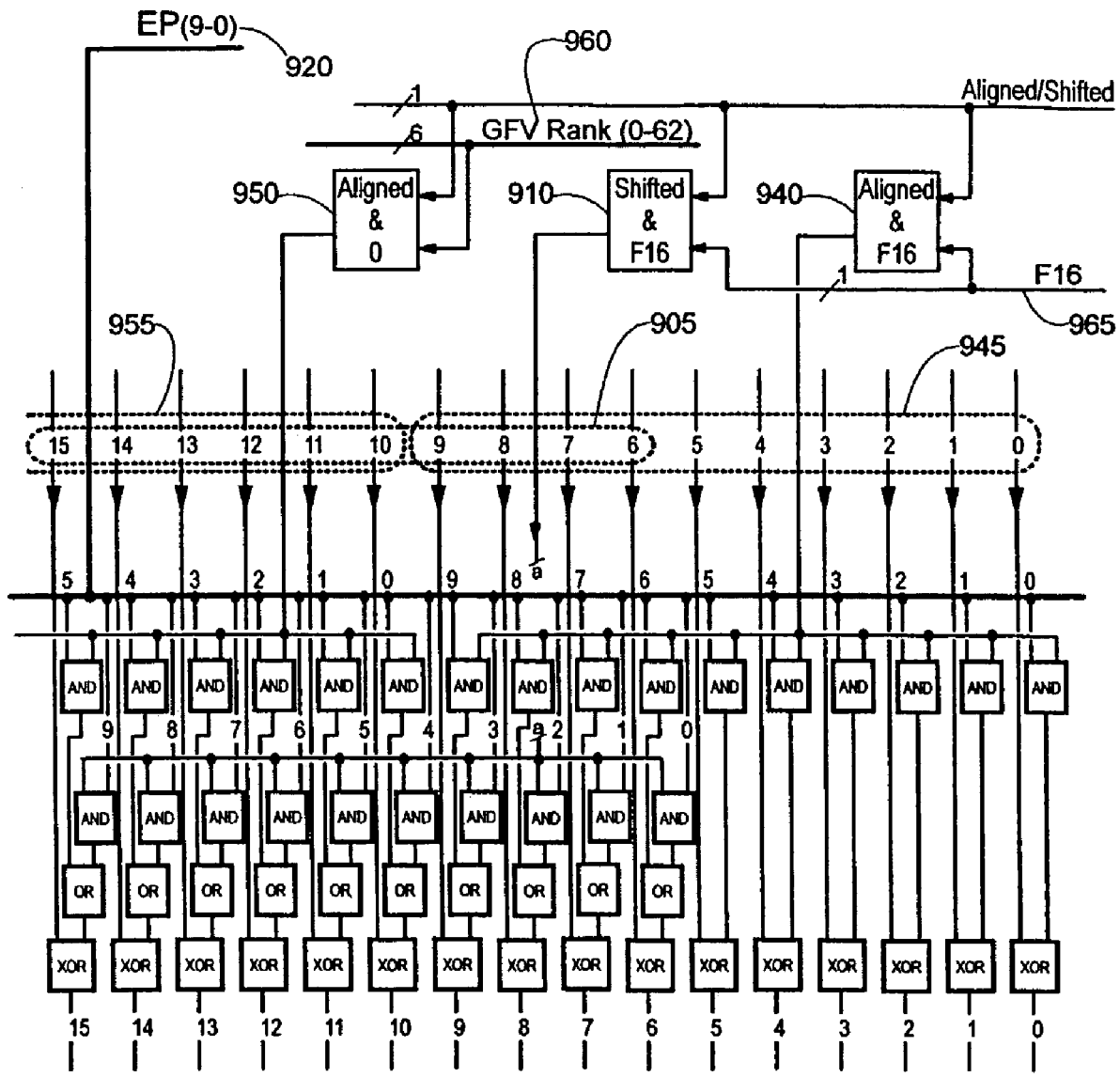
FIG. 9 illustrates the portion of a combinatorial circuit used to correct a burst of errors if errors are confined within the first 16 bits.

FIG. 9 illustrates the case of the first 16 bits (15–0). The decoding of the GFV rank (960) such as (950) does not work since the structure of the H-matrix is different for the first 16 vectors as shown in FIG. 4. However, decoding of an error occurring in the first 16 bits is trivial as was explained with reference to FIG. 6. F16 (965) is decoded directly from the analysis of the syndrome thus, bypassing the generation of GFV as illustrated by FIG. 7b. Therefore, the first aligned group (945) and the first shifted group (905) are selected when F16 is active. The first regular group, using GFV for being selected, is (955). This first regular group decodes rank 0, i.e. '000001'. When F16 is active, no other decoding can occur simultaneously because GFV 6-bit bus is set to all-zero by the logic of FIG. 7b.

Figure 10:
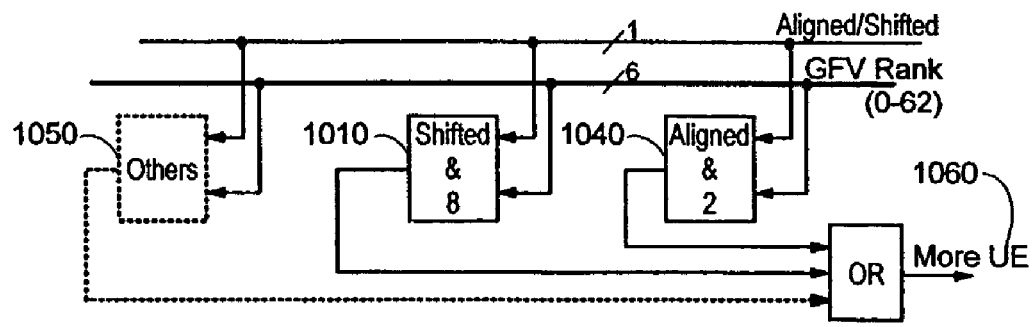
FIG. 10 illustrates the portion of a combinatorial circuit used to detect uncorrectable errors.

FIG. 10 illustrates the case of the Uncorrectable Errors (UE's) that can be found; on top of those found in FIG. 6, i.e. from the direct analysis of the syndrome, while the position of the group in error is being determined as was explained with reference to FIG. 7. The purpose of the logic shown in FIG. 7b is to find the rank of the first vector of a group (GFV). However, this calculated GFV may not exist. Refering back to FIG. 7a and ASG table (710), there is no aligned group starting with a vector of rank 2 and there is no shifted group starting with a vector of rank 8 (790). Thus, if the result of GFV calculation returns such values, respectively, for an aligned (1040) and a shifted group (1010) this must be accounted as an UE.

Also, not all groups need to be used for a particular application of a code. In the example of the present invention it is assumed that 64-byte or 512-bit packets would be switched. Then, only 52 aligned groups covering 520 bits would be necessary and FGV of all unused groups, aligned and shifted, could be included as well (1050) to improve the detection of UE's. Then, more UE's can be determined (1060).

Figure 11:
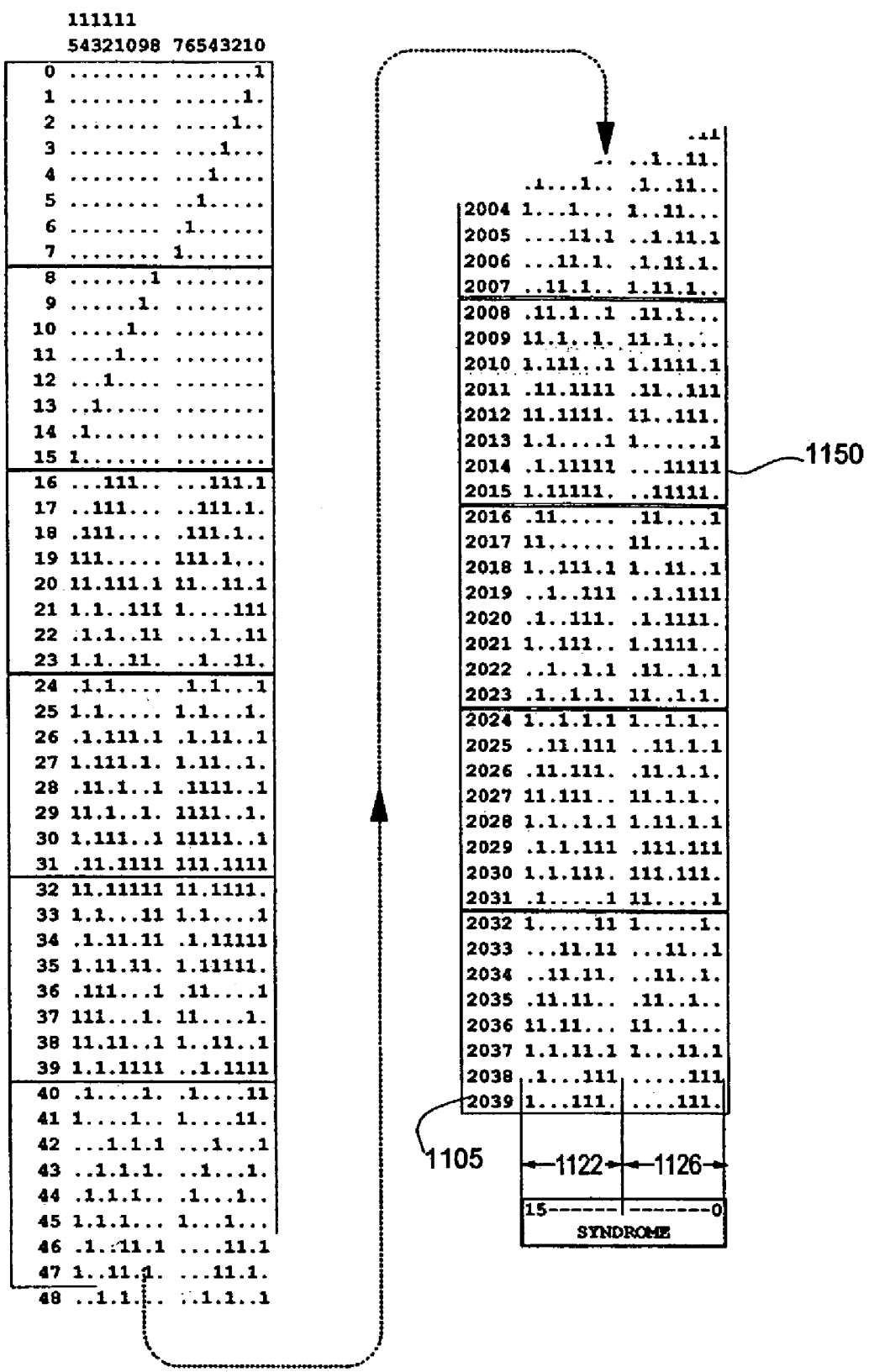
FIG. 11 illustrates the beginning and the end of a series of 16-bit binary vectors forming the H matrix of a BURTON code that illustrates a second example of using the method of the present invention.

The case of BURTON codes is illustrated in FIG. 11. BURTON codes are similar to FIRE codes. Like FIRE codes, the generator polynomial is made of the product of two polynomials, however, of the same degree. For example, such a degree-16 code is:

$$G(X)=(X^8+1)(X^8+X^4+X^3+X^2+1)$$

The right polynomial is a primitive, irreducible, polynomial like with FIRE codes. This particular code is capable of correcting up to 8-bit burst of errors. However, an important restriction versus FIRE codes is that correctable bursts are confined to positions in multiples of the degree of the polynomials, i.e. 8 in this example. The above generator polynomial allows building of an H-matrix that can be divided, in a manner similar to FIG. 2, in $2^8-=1255$ groups of 8 vectors each, e.g. group (1150). Thus, the code is of length 255×8=2040 (1105). The former number being the length of the GF that can be generated with the right degree-8 polynomial.

This type of code can be decoded as well with the method of the present invention. Because of the code's specifics, there is no MSS remaining. Only LSS (1122) and RSS (1126) are present. Also, there is no such thing as aligned and shifted groups, but only one type of 8-vector groups, in which a burst of errors must be confined to be correctable. Thus, EP is just the sum of LSS ⊕ RSS.

Logic described in FIGS. 6 to 10 can easily be accommodated, i.e. simplified, by those skilled in the art to allow the correction of BURTON codes.

Figure 12:
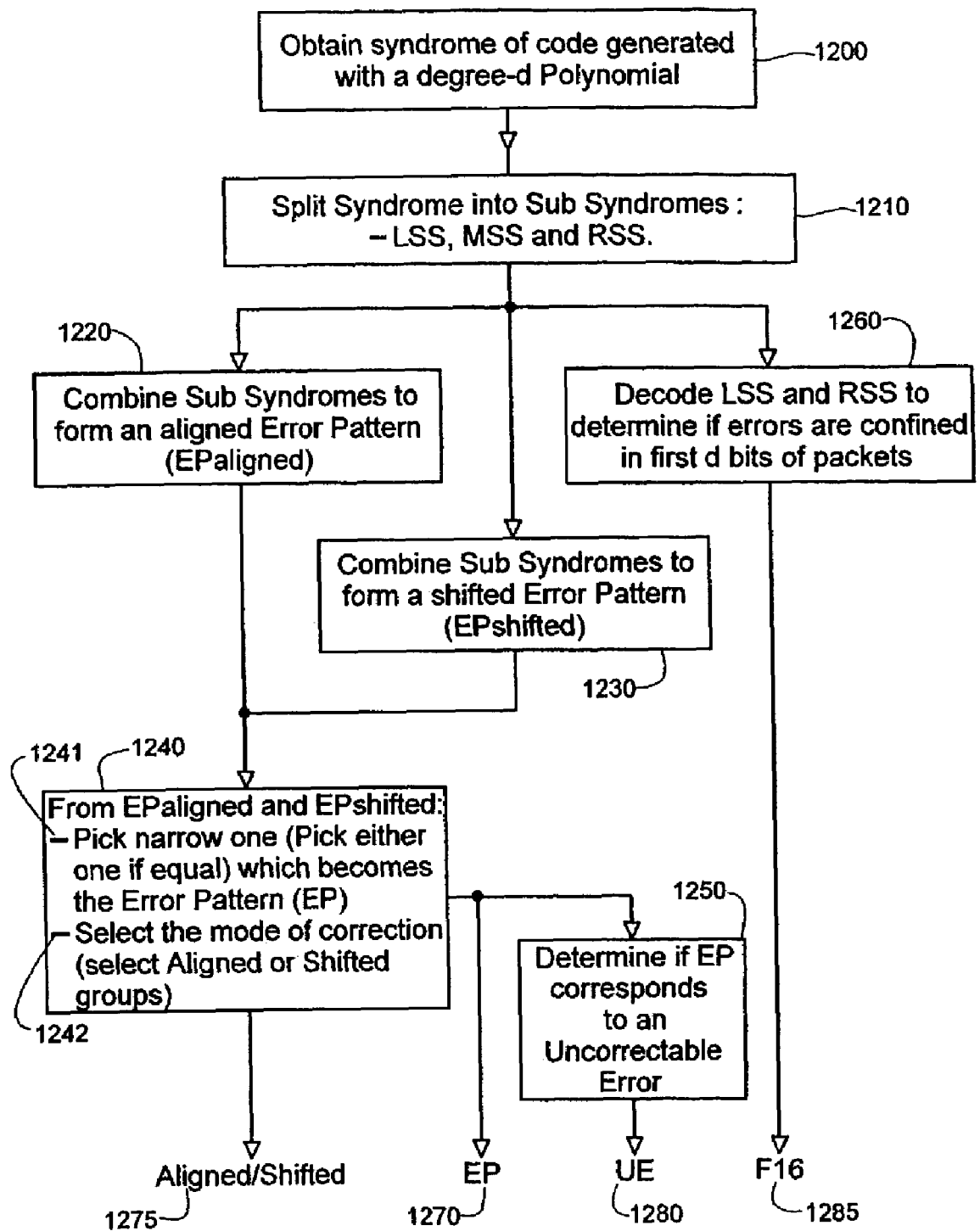
FIG. 12 illustrates the first steps of the method according to the present invention and corresponding to the generation of the error pattern and interpretation of the syndrome.

FIG. 12 illustrates the first steps of the method according to the present invention and corresponding to the generation of the error pattern (EP) and interpretation of the syndrome. The syndrome is assumed to be obtained from any method known from the art (1200). Syndrome is a d-bit wide binary vector resulting from the decode by the degree-d generator polynomial that has been used to encode the string of bits forming a message or data packet to be protected. The code must be of the kind suitable to be decoded according to the method of the present invention, e.g. FIRE codes and similar codes, especially BURTON codes that are based on generator polynomials made of the product of two factors where one factor is an irreducible polynomial allowing generation of a Galois Field (GF). Then, based on the known structure of the generator polynomial, the syndrome is split into sub-syndromes LSS, MSS, RSS (1210). Sub-syndromes are combined (1220, 1230) so as to obtain the error pattern (EP). In the general case there are two ways of forming EP (aligned and shifted). The one which is to retain is the one which gives the narrowest pattern of errors (1240). If the two give an equivalent result (pattern of error is of the same width) then, either one can be selected. Whichever choice is made also conditions the way error correction is applied, i.e. on the aligned or shifted groups. Depending on the generator polynomial in use, the middle sub-syndrome MSS may not exist. This is the case for BURTON codes in which case there is only one way of forming EP and there is actually no choice to perform at step (1240). Once EP has been obtained it is further analyzed to decide if this corresponds to a correctable error. This is known from the structure of the generator polynomial in use and theory of error correcting codes, especially the theory of FIRE codes and similar codes. If EP thus formed is an all-zero vector or corresponds to a burst of errors which is beyond what code in use is known to be able to correct, an Uncorrectable Error (UE) is found (1250). Also, from the analysis of LSS and RSS sub-syndromes it is determined if the pattern of errors is confined within the first d-bit (1260) of the coded message or data packet. Hence, the first steps of the method according to the present invention, as described with reference to FIG. 12, allow obtaining an error pattern (1270), aligned or shifted (1275), which may be uncorrectable (1280) and confined to the first d-bit of the coded message or data packet (1285). Again, in some cases, e.g. with BURTON codes, there is no such a thing as a shifted or aligned EP but just an EP and no choice has to be made.

Figure 13:
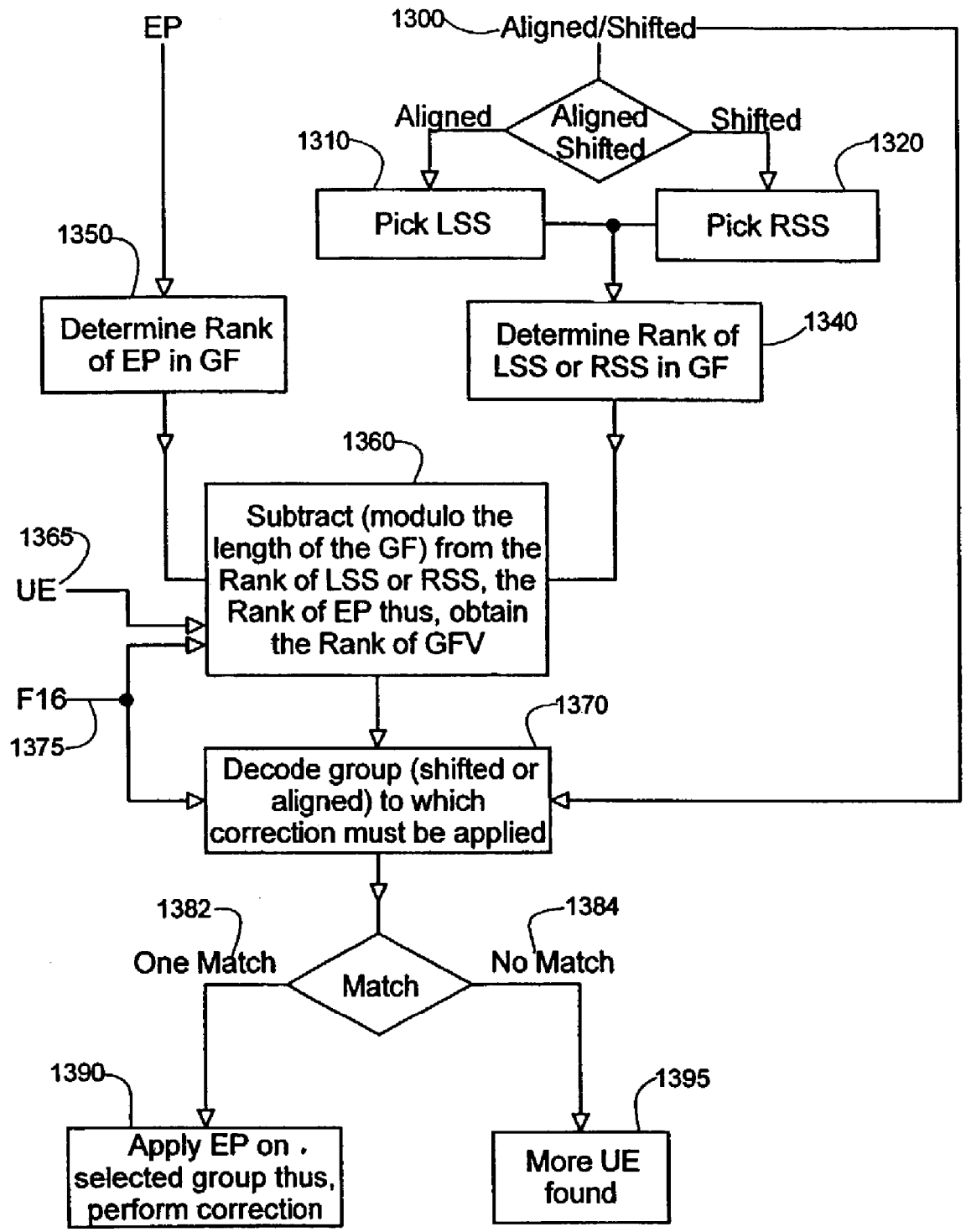
FIG. 13 illustrates the steps of the method corresponding to the correction of the errors according to the present invention.

FIG. 13 illustrates the steps of the method corresponding to the correction of the errors according to the present invention. Depending on what has been determined in previous steps, the aligned or shifted EP must be used (1300) to correct the errors. This assumes the use of LSS if aligned (1310) or RSS if shifted EP is selected (1320). Whichever is used, its rank in the Galois Field must be determined (1340) by an appropriate means, e.g. a lookup table as shown in FIG. 7a. In a similar way the rank of EP must be determined in the Galois Field (1350). Because EP is, in general, as explained previously, larger than the vectors of the Galois Field, this may require the use of a combination of lookup table and logic as shown, for example, in FIG. 7b. Whichever means is used, it must allow obtaining the rank of EP in GF. After which, the rank of a group first vector (GFV) is determined (1360). It is the difference, modulo the length of the GF, between the rank of LSS/RSS minus the rank of EP. The result of this operation allows finding and decoding the rank of the first vector of the group (aligned or shifted) to which a correction is to be applied (1370). Subtraction and decoding must take into consideration the fact that an UE (1365) has been previously determined or EP found to be confined to the first d-bit of the message or data packet (1375) to condition the correction. That is, detection of an UE must prevent any further decoding of a group where correction is to be applied while the detection of the errors being confined in the first d-bit must force the use of the first aligned or first shifted group as illustrated in FIG. 10. Thus, one match must be found (1382) to which EP is applied (1390) so as to correct the burst of errors. If, however, calculated GFV (1360) does not match any expected decode (1384), it is the indication that the error does fit the pattern of correctable errors for the code considered. Then, an UE must be reported (1395) on top of what has been directly found from the analysis of the syndrome in FIG. 12.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto.

What is claimed is:

1. A method for decoding a d-bit syndrome of FIRE code, a syndrome obtained from the checking of a message or data packet encoded according to a degree-d generator polynomial characteristic of said codes, said degree-d generator including a factor from which a Galois Field (GF) can be built, said method comprising the steps of:
    splitting said syndrome into sub-syndromes including at least a left sub-syndrome (LSS) and a right sub-syndrome (RSS) on the basis of the structure of said generator polynomial;
    combining said sub-syndromes to form at least one kind of error pattern;
    picking from said at least one kind of error pattern an error pattern (EP), said picking step comprising the steps of:
        picking an error pattern having the least spread between bits in error among said at least one kind of error pattern; and
        selecting accordingly a mode of correction;
    determining from said picked error pattern if an uncorrectable error is detected;
    decoding from said at least left sub-syndrome and right sub-syndrome to determine if errors are confined within a first d-bit of said message or data packet; and
    correcting errors within said message or data packet comprising the steps of:
        picking said left sub-syndrome or said right sub-syndrome depending on what mode of correction has been selected;
        determining a rank of said picked sub-syndrome in said Galois field;
        determining a rank of said picked error pattern in said Galois field;
        subtracting, modulo the length of said Galois field, from the rank of said picked sub-syndrome the rank of said picked error pattern, thereby obtaining a group first vector (GFV); and
        decoding whether said GFV matches with a group corresponding to said mode of correction.

2. The method according to claim 1, wherein the step of picking the picked error pattern is replaced by the step of choosing either one of said at least one kind of error patterns if they are of the same width.

3. The method according to claim 1, wherein the step of splitting said syndrome includes a middle sub-syndrome (MSS).

4. The method according to claim 1, wherein the step of selecting said mode of correction comprises selecting a set of aligned groups or a set of shifted groups over which a correction will be applied.

5. The method according to claim 1, wherein said subtracting step further comprises the step of zeroing said GFV if said uncorrectable error has been detected or if errors are confined within said first d-bit of said message or data packet.

6. The method according to claim 1, wherein said decoding step further comprises the steps of:
    forcing a match if errors are confined within said first d-bit of said message or data packet; and
    if a match is found, applying said error pattern to said group, thereby correcting the errors; or
    if no match is found, further detecting an uncorrectable error.

7. A program storage device readable by a machine, tangibly embodying a program of instructions executable by the machine to perform a method of decoding a d-bit syndrome of FIRE code, a syndrome obtained from the checking of a message or data packet encoded according to a degree-d generator polynomial characteristic of said codes, said degree-d generator including a factor from which a Galois Field (GF) can be built, said method comprising the steps of:
    splitting said syndrome into sub-syndromes including at least a left sub-syndrome (LSS) and a right sub-syndrome (RSS) on the basis of the structure of said generator polynomial;
    combining said sub-syndromes to form at least one kind of error pattern;
    picking from said at least one kind of error pattern an error pattern (EP), said picking step comprising the steps of:
        picking an error pattern having the least spread between bits in error among said at least one kind of error pattern; and
        selecting accordingly a mode of correction;
    determining from said picked error pattern if an uncorrectable error is detected; and
    decoding from said at least left sub-syndrome and right sub-syndrome to determine if errors are confined within a first d-bit of said message or data packet; and
    correcting errors within said message or data packet comprising the steps of:
        picking said left sub-syndrome or said right sub-syndrome depending on what mode of correction has been selected;
        determining a rank of said picked sub-syndrome in said Galois field;
        determining a rank of said picked error pattern in said Galois field;
        subtracting, modulo the length of said Galois field, from the rank of said picked sub-syndrome the rank of said picked error pattern, thereby obtaining a group first vector (GFV); and
        decoding whether said GFV matches with a group corresponding to said mode of correction.

* * * * *